United States Patent [19]
Colarossi et al.

[11] Patent Number: 6,011,439
[45] Date of Patent: Jan. 4, 2000

[54] LOW POWER RF AMPLIFIER

[75] Inventors: Vincent Colarossi; John F. Kennedy, both of Dearborn; Matt David Gerard, Westland, all of Mich.

[73] Assignee: Ford Global Technologies, Inc., Dearborn, Mich.

[21] Appl. No.: 08/926,079

[22] Filed: Sep. 2, 1997

[51] Int. Cl.$^7$ .................................. H03F 1/30; H03F 3/19
[52] U.S. Cl. ................... 330/290; 330/290; 330/310; 330/311; 330/88; 455/232.1; 455/334; 455/341; 455/311; 340/825.34; 340/825.69; 340/825.72
[58] Field of Search .................................. 455/232.1, 334, 455/341, 311; 330/310, 311, 88, 98, 125, 290, 825; 340/825.34, 825.69, 825.72

[56] References Cited

U.S. PATENT DOCUMENTS

| | | | |
|---|---|---|---|
| 2,803,712 | 8/1957 | Hannisberg . | |
| 3,119,966 | 1/1964 | Slavin et al. | 455/341 |
| 3,360,734 | 12/1967 | Kimball et al. | 330/25 |
| 3,544,089 | 12/1970 | Uzunoglu | 330/290 |
| 3,544,809 | 12/1970 | Uzunoglu | 330/290 |
| 3,691,465 | 9/1972 | McFadyen | 325/319 |
| 5,017,927 | 5/1991 | Agrawal et al. | 342/371 |
| 5,153,143 | 10/1992 | Schlais et al. | 437/43 |
| 5,493,255 | 2/1996 | Murtojarvi | 330/296 |
| 5,497,125 | 3/1996 | Royds | 330/290 |
| 5,548,248 | 8/1996 | Wang | 330/290 |
| 5,717,361 | 2/1998 | Saito | 330/290 |
| 5,812,051 | 9/1998 | Talbot et al. | 340/823.69 |

*Primary Examiner*—Wellington Chin
*Assistant Examiner*—Simon Nguyen
*Attorney, Agent, or Firm*—Mark L. Mollon; Roger L. May

[57] ABSTRACT

A radio frequency amplifier includes a first amplifier stage having a first transistor, and a second amplifier stage having a second transistor. The first transistor has a base input for receiving an input voltage, a collector output, and an emitter coupled to a common. The second transistor has a base input coupled to the first transistor collector output, a collector output, and an emitter coupled to the common by a resistance element. The second transistor emitter is DC coupled to the first transistor base. The DC coupling of the first transistor base to the second transistor emitter provides stable DC biasing of the first and second transistors based on base-emitter voltages of the first and second transistors. The radio frequency amplifier may be employed in a variety of receiver/amplifier applications, such as vehicular driver integrity check systems.

20 Claims, 2 Drawing Sheets

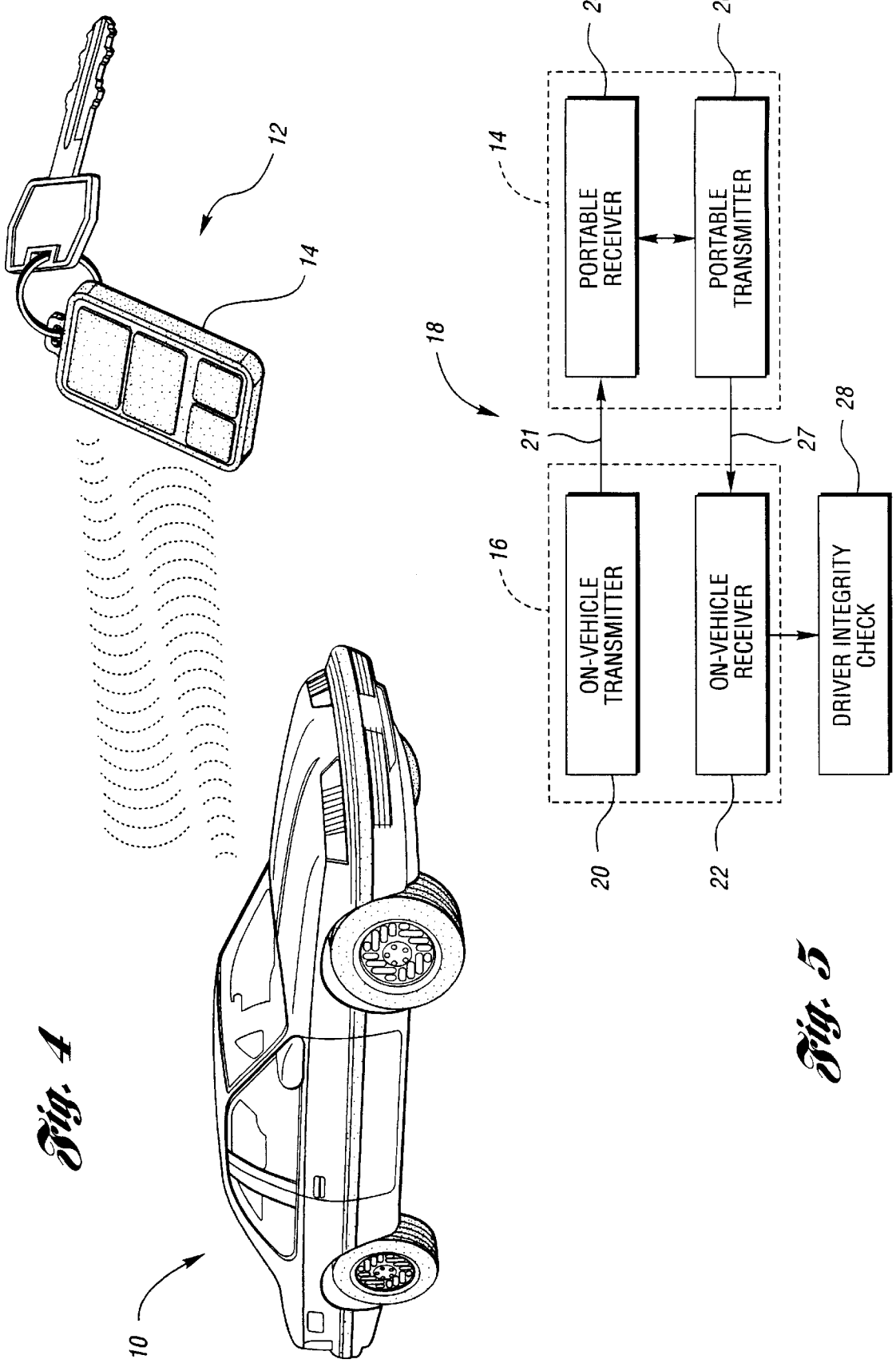

LOW POWER RF AMPLIFIER

TECHNICAL FIELD

The present invention relates to low power radio frequency amplifiers.

BACKGROUND ART

Low power radio frequency amplifiers are typically used in low power receiver/amplifier systems in which it is desired to have reduced power consumption. An example of an application for a low power receiver/amplifier system is a vehicular driver integrity check system, such as a keyless entry system.

A primary disadvantage of existing low power radio frequency amplifier configurations is the fact that DC bias currents through the transistor amplifier stages are very sensitive to variations in environment temperature. Bias current sensitivity to temperature results in the amplifier gain being very sensitive to temperature variations. Further, total DC bias current, which may be drawn from a battery source, is very sensitive to temperature variations. Increased DC bias current draw at higher temperatures causes undesired decreased battery life in battery operated systems.

SUMMARY OF THE INVENTION

It is, therefore, an object of the present invention to provide an improved low power radio frequency amplifier that is insensitive to variations in environment temperature.

In carrying out the above object, other objects, and features of the present invention, a low power radio frequency amplifier is provided. The radio frequency amplifier comprises a first amplifier stage including a first transistor, and a second amplifier stage including a second transistor. The first transistor has a base input for receiving an input voltage, a collector output, and an emitter coupled to a common. The second transistor has a base input coupled to the first transistor collector output, a collector output, and an emitter coupled to the common by a resistance element. The second transistor emitter is DC coupled to the first transistor base. The DC coupling of the first transistor base to the second transistor emitter provides stable DC biasing of the first and second transistors based on base-emitter voltages of the first and second transistors.

Further, in carrying out the present invention, a low power portable radio frequency receiver for use with a corresponding transmitter in a vehicular driver integrity check system is provided. An antenna is coupled to the first transistor base, and is capable of receiving a radio frequency signal to provide an AC component of the input voltage at the first transistor base. Preferably, the antenna comprises an inductor DC coupling the second transistor emitter to the first transistor base.

Still further, in carrying out the present invention, a vehicular driver integrity check system is provided. The system includes an on-vehicle transmitter for generating a first signal, an identification device including a portable receiver for detecting the first signal and a portable transmitter for generating a second signal upon detection of the first signal. The system further includes an on-vehicle receiver for detecting the second signal and generating an output signal indicative of reception of the second signal which verifies driver integrity. The portable receiver comprises a low power radio frequency receiver of the present invention.

The above object and other objects, features, and advantages of the present invention will be readily appreciated by one of ordinary skill in the art from the following detailed description of the best mode for carrying out the invention when taken in connection with the accompanying drawings.

BRIEF DESCRIPTION OF THE DRAWINGS

FIG. 4 is a vehicular driver integrity check system made in accordance with the present invention; and FIG. 5 is a block diagram of a vehicular driver integrity check system of the present invention.

BEST MODE FOR CARRYING OUT THE INVENTION

Figure 1:
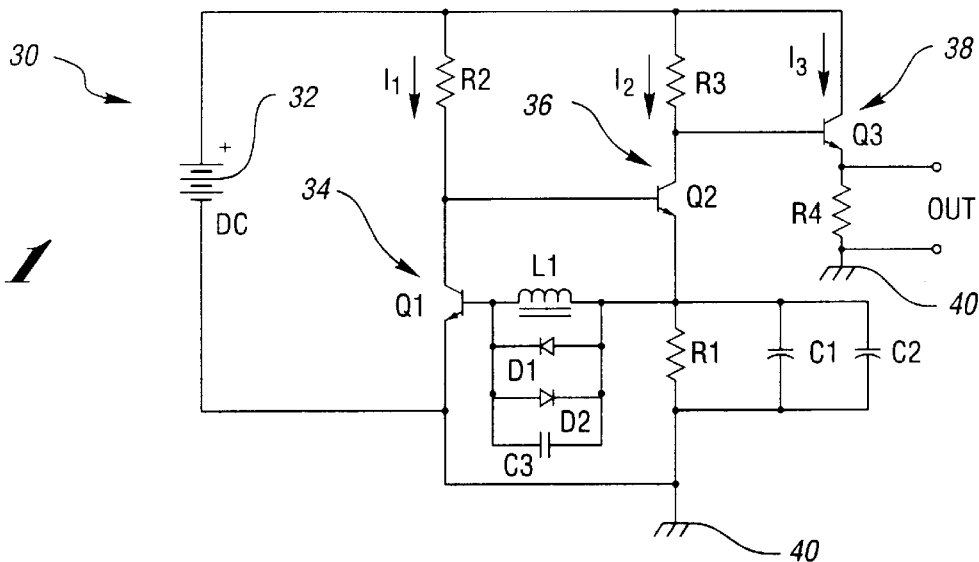
FIG. 1 is a schematic drawing of an embodiment of a receiver having a low power radio frequency amplifier of the present invention.

Referring to FIG. 1, a schematic diagram of an embodiment of a radio frequency receiver of the present invention is illustrated. The circuit 30 is powered by a battery source 32 which is preferably about 3 volts. A first amplifier stage 34 is formed by a first transistor Q1 and a resistor R2. Transistor amplifier 34 is of the common-emitter type having a base input, collector output, and an emitter coupled to a common 40.

A second amplifier stage 36 is formed by a second transistor Q2 and a resistor R3. Second transistor amplifier 36 is also of the common-emitter type having a base input coupled to the collector output of first transistor Q1, a collector output, and an emitter coupled to the common 40 by a resistor R1. In order to provide stable DC biasing of transistor Q1 and transistor Q2, the emitter of transistor Q2 is DC coupled to the base of transistor Q1, preferably by an inductor L1. Alternatively, a resistor (not shown) may be employed to DC couple the emitter of transistor Q2 to the base of transistor Q1.

In a preferred embodiment, an antenna is formed by inductor L1 and tuning capacitor C3 which are preferably coupled in parallel to form a tuned circuit. The resonant tuned circuit tunes the antenna to a desired transmitted frequency. The antenna provides a very low DC resistance path from the emitter of transistor Q2 to the base of transistor Q1. This low resistance path closes a DC feedback loop between Q1 and Q2 and reduces input noise as will be described. The antenna receives the radio frequency signal to provide the AC component of the input voltage at the base of transistor Q1. An amplitude limiter circuit for the antenna is formed by diodes D1 and D2 configured in a back-to-back parallel configuration. The amplitude limiter circuit prevents excessive voltage differences across the base-emitter junction of transistor Q1.

Preferably, inductor L1 and tuning capacitor C3 are selected based on input impedance of transistor Q1 to provide a passive voltage gain upon reception of the desired transmitted frequency. Transistors Q1 and Q2 may be formed with dielectrically isolated silicon on insulator (DI-SOI) technology to perform at low voltages, and to provide the input impedance at the base of transistor Q1 to allow the desirable passive voltage gain. The first and second amplifier stages may be formed by discrete components, integrated circuitry, or a combination of both discrete components and integrated circuitry. Alternatively, the base of transistor Q1 may be DC coupled to the emitter of transistor Q2 by an inductive element or resistive element, and AC coupled to a separate antenna.

First and second capacitors C1 and C2 AC couple the emitter of second transistor Q2 to the common 40. The capacitor C1 has a capacitance selected so as to maintain the first transistor Q1 in an active region of operation during large signal swings of the AC component of the input voltage across inductor L1. Particularly, transistor Q1 remains active when a large signal swing causes transistor Q2 to enter a cutoff region of operation. C1 does this by providing enough energy storage capability to allow Q2 to enter cutoff state and remain there for the longest data transmission pulse width, which typically occurs at near field overload conditions. The larger the value of C1, the better the capability of the circuit 30 to respond to near field overload conditions.

The capacitance of C1 is also selected to reduce the input noise created by the resistor R1. The magnitude of thermal noise of resistor R1 may be found to be $(4*k*T*R1*BW)^{0.5}$, wherein k is the Boltzmann constant, T is temperature in Kelvin, and BW is the bandwidth of the noise spectrum in Hertz. C1 and R1 provide a low pass filter that restricts the BW term of the preceding equation.

The capacitor C2 has a capacitance selected so as filter high frequency noise in the AC component of the input voltage.

The primary purpose of C1 and C2 is to provide an AC short between transistor Q2's emitter and the common 40. C1 has typically a substantially larger capacitive value than C2. Large capacitors typically have a lower frequency range of useful operation due to the self-resonant frequency of the component. The purpose of C2 is to extend this operation range.

The low AC impedance on Q2's emitter to common serves two primary functions. First, in combination with the emitter resistance of Q2, $r_e$, forms a voltage divider to prevent AC negative feedback between Q2's emitter and Q1's base terminal. This separates the AC and DC loops of the amplifier and forces Q1 and Q2 to operate as a two-stage voltage amplifier under AC conditions. Secondly, this low AC impedance forces Q2 to operate as a common-emitter voltage amplifier stage. This results in a two-stage common-emitter voltage amplifier.

Preferably, capacitor C1 is a ceramic or Tantalum or a low leakage electrolytic capacitor having a capacitance of about 0.1–10 microfarads. Preferably, capacitor C2 is a ceramic parallel plate capacitor having a capacitance of about 0.1 microfarads or less. In one embodiment, C1 has a capacitance of about 4.7 microfarads; and, C2 has a capacitance of about 0.01 microfarads.

A third amplifier stage 38 is formed by third transistor Q3 and load resistor R4. Transistor amplifier 38 is of the emitter-follower type to provide a buffered output for the receiver circuit 30. Resistor R4 is DC coupled to the emitter of transistor Q3, and the amplifier radio frequency output signal is taken across resistor R4. Battery source 32 supplies power to source currents $I_1$, $I_2$, $I_3$ for transistors Q1, Q2, and Q3, respectively.

The present invention provides a novel three-stage high voltage gain transistor amplifier DC biasing technique. The amplifier is desirably forced to operate in the microampere range. The operation of the stable DC biasing DC closed loop control will now be described.

The voltage on resistor R1 is equal to the base-emitter voltage of Q1. This is accomplished by having the collector of transistor Q1 control the base voltage of transistor Q2.

The current through the transistor Q2 produces the voltage across resistor R1. The voltage at the collector of transistor Q1 is equal to the sum of the base-emitter voltage of transistor Q1 and the base-emitter voltage of transistor Q2. Thus, the collector voltage of transistor Q1 and battery voltage determine the voltage drop across resistor R2, which determines the current through transistor Q1. As described immediately above, transistors Q1 and Q2 will operate at a stable equilibrium due to the DC closed loop configuration.

The current $I_3$ through transistor Q3 is determined by the emitter output voltage of transistor Q3 and resistor R4. The emitter output voltage of transistor Q3 is the collector output voltage of transistor Q2 minus the base-emitter voltage of transistor Q3. In the novel low power radio frequency amplifier configuration of the present invention, the currents $I_1$, $I_2$, and $I_3$ are all based on transistor base-emitter voltages, resistor values, and the battery voltage.

In accordance with embodiments of the present invention, a linear change in transistor base-emitter voltage of Q1 produces a linear change in the branch currents, $I_1$, $I_2$, and $I_3$ due to the arrangement of the resistors. This is particularly advantageous for operating the receiver at varying temperatures.

It is known that a p-n junction diode drop $V_D$ varies substantially linearly with linear changes in temperature. Since the base-emitter junctions of transistors Q1, Q2, and Q3 operate in a similar manner when the transistors are biased into the active region of operation, a similar effect occurs. At 25° C., diode voltage drop $V_D$ across a base-emitter junction equals about 0.65 volts. The temperature coefficient $T_c$ is the rate at which $V_D$ changes with respect to temperature. A practical value for the temperature coefficient $T_c$ for a bi-polar transistor base-emitter junction is about −2.2 millivolts per degree Celsius. By mathematical analysis of the circuit shown in FIG. 1, an expression for total DC bias current $I_T$ which is equal to branch current sum $I_1+I_2+I_3$ is obtained. To simplify the analysis, the temperature coefficients of the resistors may be ignored, the base-emitter voltages of the transistors Q1, Q2, and Q3 may be considered identical, and the temperature coefficients of the base-emitter junctions of the three transistors may be considered identical at −2.2 millivolts per degree Celsius. To minimize the total DC bias current sensitivity to fluctuations in the base-emitter voltages, it is desirable to select the resistor values such that:

$$1/R1=2/R2+R3/(R1\times R4)+1/R4$$

Representative resistive value which reduce total DC bias current sensitivity to fluctuations in the base-emitter voltages of the transistors are:

R1=130 k ohms,

R2=330 k ohms,

R3=130 k ohms, and

R4=260 k ohms.

Figure 2:
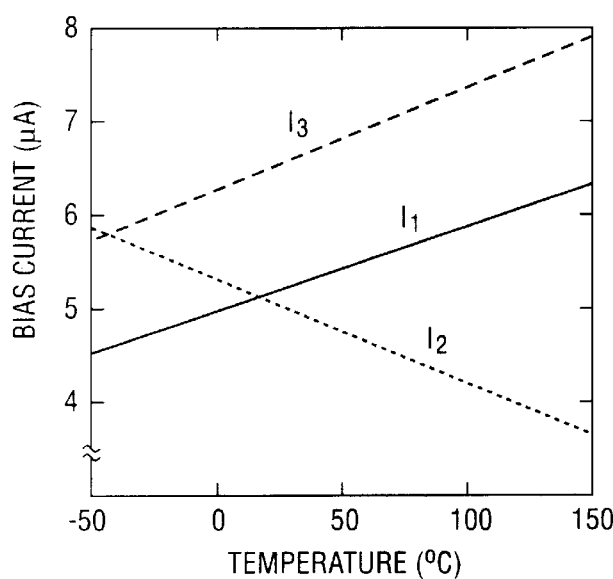
FIG. 2 is a graph depicting transistor DC bias current of the three transistors shown in FIG. 1 versus temperature.

Referring to FIG. 2, a graph depicts the bias currents $I_1$, $I_2$, and $I_3$ through transistors Q1, Q2, and Q3, respectively, versus temperature in degrees Celsius. The graph illustrates the trend of the branch currents when the resistors are selected as the representative values stated immediately above.

Figure 3:
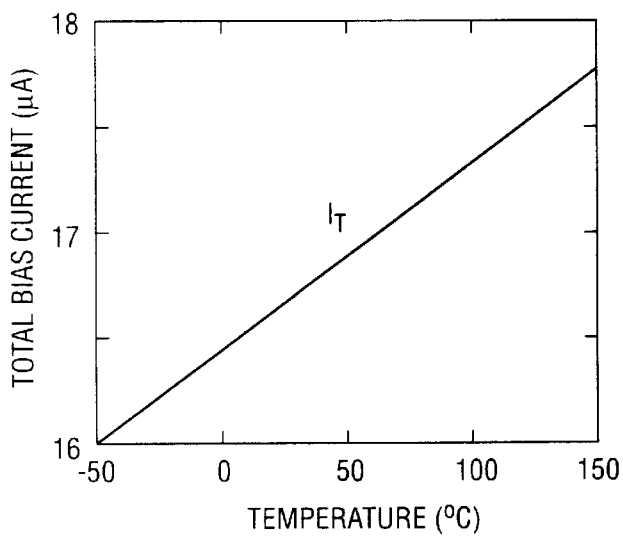
FIG. 3 is a graph depicting total DC bias current draw from the battery source shown in FIG. 1 versus temperature.

Referring to FIG. 3, a graph depicts total bias current $I_T$ sourced by the battery versus temperature in degrees Celsius. As shown, by careful selection of the resistor values, total DC bias current sensitivity to temperature is reduced. Because the total DC bias current is sourced by the battery source, this is very advantageous in that battery life may be prolonged substantially. The life of a 3 volt battery source may be extended up to about 2 years in a low power radio frequency receiver of the present invention.

Another feature of the amplifier is that the amplifier voltage gain is dependent on the ratio of resistance elements in the collectors to the emitter resistance, $r_e$, of transistors Q1 and Q2. The collector resistance values are designated by R2 and R3. The value of $r_e$ may be found to be $V_t/I_c$, wherein $V_t$ is the thermal voltage and $I_c$ is the collector current. Because branch currents I1 and I2 have opposite temperature coefficients, the respective amplifier gain values are mutually compensating. By careful selection of the resistor values, voltage gain sensitivity to temperature may be reduced. Appropriate resistance values may be determined by analysis of the appropriate amplifier voltage gain equations.

In accordance with the present invention, both total DC bias current and amplifier gain sensitivity to fluctuations in environment temperature may be controlled. When the antenna does not receive an RF signal to produce an AC component of the input voltage, transistors Q1 and Q2 are each DC biased into an active region of operation via battery source 32. When the antenna receives a radio frequency signal to produce a small signal AC component at the base of transistor Q1, circuit 30 operates as a three-stage transistor amplifier. The emitter output of transistor Q3 may be coupled to an envelope detector to detect the envelope of the amplified signal. When the antenna receives a radio frequency signal to produce a large signal AC component at the base of transistor Q1, which is sufficiently large to cause transistor Q2 to enter a cutoff region of operation, and remain in the cutoff region of operation due to the base-emitter capacitance of the transistor Q1, capacitor C1 maintains transistor Q1 in the active region of operation. Transistor Q3 operates in the active region of operation, pulling the amplifier output high. The envelope detector may then detect the envelope of the amplified signal, in the same manner as if the transistor Q1 base-emitter input were a small signal. It is to be appreciated that embodiments of the present invention provide a detectable receiver output for AC antenna input signals from as small as about 1 millivolt to as large as about 1 volt, without the need for automatic gain control. In a receiver having the representative resistance values stated in the preceding description, a low pass filter having a peak frequency at about 131 kHz with a 65 decibel voltage gain about the peak frequency is achieved.

Referring now to FIG. 4, a vehicle is generally indicated at 10. A portable identification device 14 attached to a key ring is generally indicated at 12. The identification device 14 includes a portable low power radio frequency receiver and a portable radio frequency transmitter for two-way communication with the vehicle 10, as shown.

Referring to FIGS. 1 and 2, the vehicular driver integrity check system, indicated in schematic at 18, includes the portable identification device 14, and on-vehicle component 16. On-vehicle component 16 includes on-vehicle transmitter 20 and on-vehicle receiver 22. Identification device 14 includes portable receiver 24 and portable transmitter 26. It is to be appreciated that identification device 14 may be incorporated into a key. On-vehicle transmitter 20 generates a first radio frequency signal 21. Portable receiver 24 detects the first signal 21, and is in communication with portable transmitter 26. Portable transmitter 26 generates a second signal 27 upon detection of the first signal 21 by portable receiver 24.

The first signal 21, which is generated by on-vehicle transmitter 20, is preferably a pulsed signal which is intermittently transmitted every several milliseconds.

The second signal 27, which is generated by portable transmitter 26, is preferably in the ultra high frequency range and is transmitted selectively upon detection of the first signal 21. The second signal 27 may also be an intermittently pulsed signal. The on-vehicle receiver 22 detects the second signal 21, and generates an output signal indicative of reception of the second signal 27 which verifies driver integrity 28.

In one embodiment, the system is designed such that the vehicle doors will unlock whenever the identification device 14 is near the vehicle to verify driver integrity. When portable receiver 24 of identification device 14 is too far away from vehicle 10 to receive the signal from the on-vehicle transmitter 22, portable transmitter 26 will not generate the second signal 27. On-vehicle receiver 22 accordingly will not detect a signal from the identification device 14, and the vehicle doors will automatically lock, or remain locked if locked already.

In another embodiment, the system is designed such that the starter will be disabled unless the identification device 14 is near the vehicle to verify driver integrity.

It is to be appreciated that preferred embodiments of the present invention utilize dielectrically isolated silicon on insulator (DI-SOI) bi-polar junction transistors. However, embodiments of the present invention may employ other types of transistors such as field effect transistors including, for example, MOSFETs.

While the best mode for carrying out the invention has been described in detail, those familiar with the art to which this invention relates will recognize various alternative designs and embodiments for practicing the invention as defined by the following claims.

What is claimed is:

1. A low power radio frequency amplifier comprising:
   a first amplifier stage including a first transistor having a base input for receiving an input voltage, a collector output, and an emitter coupled to a common; and
   a second amplifier stage including a second transistor having a base input coupled to the first transistor collector output, a collector output, and an emitter coupled to the common by a resistive element, and further being DC coupled to the first transistor base by an inductor to provide stable DC biasing of the first and second transistors based on base-emitter voltages of the first and second transistors.

2. The low power radio frequency amplifier of claim 1 further comprising:
   an amplitude limiter circuit coupled to the antenna to limit the AC component of the input voltage.

3. The low power radio frequency amplifier of claim 2 further comprising:
   a tuning capacitor coupled in parallel to the inductor forming a resonant tuned circuit for tuning the antenna to a desired transmitted frequency.

4. The low power radio frequency amplifier of claim 3 wherein the inductor and tuning capacitor are selected based on input impedance of the first transistor to provide a passive voltage gain at the desired transmitted frequency.

5. The low power radio frequency amplifier of claim 1 further comprising:
   a first capacitor AC coupling the second transistor emitter to the common, the first capacitor having a capacitance selected so as to maintain the first transistor in an active region of operation during large signal swings of an AC component of the input voltage which cause the second transistor to enter a cutoff region of operation.

6. The low power radio frequency amplifier of claim 5 further comprising:
a second capacitor coupling the second transistor emitter to the common, the second capacitor having a capacitance selected so as to filter high frequency noise from the AC component of the input voltage.

7. The low power radio frequency amplifier of claim 1 further comprising:
a battery source coupled to the first transistor collector by a first collector resistor, and coupled to the second transistor collector by a second collector resistor, the battery source providing DC bias current for the first and second transistors.

8. The low power radio frequency amplifier of claim 7 further comprising:
a third amplifier third transistor.

9. The low power radio frequency amplifier of claim 8 wherein the resistance element is an emitter resistor, and wherein the resistances of the emitter resistor, first collector resistor, second collector resistor, and load resistor are selected so as to reduce total DC bias current sensitivity to fluctuations in the base-emitter voltages of the first, second, and third transistors due to variations in environment temperature.

10. The low power radio frequency amplifier of claim 8 wherein the resistance element is an emitter resistor, and wherein the resistances of the emitter resistor, first collector resistor, second collector resistor, and load resistor are selected so as to reduce amplifier gain sensitivity to fluctuations in the base-emitter voltages of the first, second, and third transistors due to variations in environment temperature.

11. The low power radio frequency amplifier of claim 8 wherein the battery source supplies a voltage of substantially 3 volts.

12. The low power radio frequency amplifier of claim 1 wherein the first and second transistors are formed of dielectrically isolated silicon on insulator (DI-SOI).

13. The low power radio frequency amplifier of claim 12 wherein the first and second amplifier stages are formed as an integrated circuit.

14. A low power radio frequency receiver for use with a corresponding transmitter in a vehicular driver integrity check system, the receiver comprising:
a first amplifier stage including a first transistor having a base input for receiving an input voltage, a collector output, and an emitter coupled to a common; and
a second amplifier stage including a second transistor having a base input coupled to the first transistor collector output, a collector output, and an emitter coupled to the common by a resistance element, and further being DC coupled to the first transistor base by an inductor to provide stable DC biasing of the first and second transistors based on base-emitter voltages of the first and second transistors; wherein the inductor comprises an antenna for receiving a radio frequency signal to provide an AC component of the input voltage at the first transistor base.

15. The low power radio frequency receiver of claim 14 further comprising:
a battery source coupled to the first transistor collector by a first collector resistor, and coupled to the second transistor collector by a second collector resistor; and
a third amplifier stage including a third transistor having a base input coupled to the second transistor collector output, a collector coupled to the battery source, and an emitter output coupled to a load resistor to provide a buffered output, the battery source providing DC bias current for the first, second, and third transistors.

16. The low power radio frequency amplifier of claim 15 wherein the resistance element is an emitter resistor, and wherein the resistances of the emitter resistor, first collector resistor, second collector resistor, and load resistor are selected so as to reduce total DC bias current sensitivity to fluctuations in the base-emitter voltages of the first, second, and third transistors due to variations in environment temperature.

17. The low power radio frequency amplifier of claim 15 wherein the resistance element is an emitter resistor, and wherein the resistances of the emitter resistor, first collector resistor, second collector resistor, and load resistor are selected so as to reduce amplifier gain sensitivity to fluctuations in the base-emitter voltages of the first, second, and third transistors due to variations in environment temperature.

18. A vehicular driver integrity check system including an on-vehicle transmitter for generating a first signal, an identification device including a portable receiver for detecting the first signal and a portable transmitter for generating a second signal upon detection of the first signal, the system further including an on-vehicle receiver for detecting the second signal and generating an output signal indicative of reception of the second signal which verifies driver integrity, wherein the portable receiver comprises:
a first amplifier stage including a first transistor having a base input for receiving an input voltage, a collector output, and an emitter coupled to a common;
a second amplifier stage including a second transistor having a base input coupled to the first transistor collector output, a collector output, and an emitter coupled to the common by a resistance element and further being DC coupled to the first transistor base by an inductor to provide stable DC biasing of the first and second transistors based on base-emitter voltages of the first and second transistors wherein the inductor comprises an antenna for receiving a radio frequency signal to provide an AC component of the input voltage at the first transistor base.

19. A low power radio frequency amplifier comprising:
a first amplifier stage including a first transistor having a base input for receiving an input voltage, a collector output, and an emitter coupled to a common; and
a second amplifier stage including a second transistor having a base input coupled to the first transistor collector output, a collector output, and an emitter coupled to the common by a resistive element, and further being DC coupled to the first transistor base to provide stable DC biasing of the first and second transistors based on base-emitter voltages of the first and second transistors, further comprising a first capacitor AC coupling the second transistor emitter to the common, the first capacitor having a capacitance selected so as to maintain the first transistor in an active region of operation during large signal swings of an AC component of the input voltage which cause the second transistor to enter a cutoff region of operation.

20. A low power radio frequency amplifier comprising:
a first amplifier stage including a first transistor having a base input for receiving an input voltage, a collector output, and an emitter coupled to a common;
a second amplifier stage including a second transistor having a base input coupled to the first transistor collector output, a collector output, and an emitter coupled to the common by a resistive element, and further being DC coupled to the first transistor base to provide stable DC biasing of the first and second transistors based on base-emitter voltages of the first and second transistors;

a battery source coupled to the first transistor collector by a first collector resistor, and coupled to the second transistor collector by a second collector resistor, the battery source providing DC bias current for the first and second transistors; and a third amplifier third transistor, wherein the resistance element is an emitter resistor, and wherein the resistances of the emitter resistor, first collector resistor, second collector resistor, and load resistor are selected so as to reduce total DC bias current sensitivity to fluctuations in the base-emitter voltages of the first, second, and third transistors due to variations in environment temperature.

* * * * *